United States Patent
Siemieniec et al.

(10) Patent No.: US 7,652,325 B2
(45) Date of Patent: Jan. 26, 2010

(54) FIELD EFFECT CONTROLLABLE SEMICONDUCTOR COMPONENT WITH IMPROVED INVERSE DIODE AND PRODUCTION METHODS THEREFOR

(75) Inventors: Ralf Siemieniec, Villach (AT); Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 501 days.

(21) Appl. No.: 11/364,891

(22) Filed: Feb. 28, 2006

(65) Prior Publication Data
US 2006/0211179 A1    Sep. 21, 2006

(30) Foreign Application Priority Data
Feb. 28, 2005    (DE) .................. 10 2005 009 000

(51) Int. Cl.
*H01L 29/94* (2006.01)
(52) U.S. Cl. .................. 257/328; 257/330; 257/335; 257/E29.131; 257/E29.257; 257/E29.26
(58) Field of Classification Search ......... 257/328–330, 257/335, E29.027, E29.066, E29.131, E29.256, 257/E29.257, E29.26
See application file for complete search history.

(56) References Cited

U.S. PATENT DOCUMENTS

| | | | |
|---|---|---|---|
| 4,941,026 | A | 7/1990 | Temple |
| 5,558,313 | A | 9/1996 | Hshieh et al. |
| 5,814,858 | A | 9/1998 | Williams |
| 6,054,369 | A | 4/2000 | Neilson et al. |
| 6,545,316 | B1 | 4/2003 | Baliga |
| 6,677,210 | B1 | 1/2004 | Herbert |

(Continued)

FOREIGN PATENT DOCUMENTS

DE    199 50 579    5/2001

(Continued)

OTHER PUBLICATIONS

Schmitt, M. et al. "A Comparison of Electron, Proton and Helium Io Irradiation for the Optimization of the CoolMOS Body Diode." *Proc. ISPSD*. Sante Fe: 2002.

*Primary Examiner*—Matthew E Warren
(74) *Attorney, Agent, or Firm*—Maginot, Moore & Beck (57) ABSTRACT

The invention relates to a semiconductor component, which comprises a semiconductor body having a first and a second terminal zone of a first conduction type (n), a channel zone of a second conduction type (p), which is short circuited with the second terminal zone, a drift zone of the first conduction type (n) with weaker doping than the terminal zones, which drift zone is formed between the channel zone and the first terminal zone, the channel zone being formed between the drift zone and the second terminal zone, a control electrode, formed so that it is insulated from the channel zone, for controlling a conductive channel in the channel zone between the second terminal zone and the drift zone, and is distinguished in that a field stop zone of the first conduction type (n) is formed between the first terminal zone and the drift zone, the field stop zone having heavier doping than the drift zone and weaker doping than the first terminal zone, the maximum doping of the field stop zone being at most a factor of about $10^2$ heavier than the doping of the drift zone.

21 Claims, 3 Drawing Sheets

U.S. PATENT DOCUMENTS

| | | |
|---|---|---|
| 6,693,338 B2 | 2/2004 | Saitoh |
| 6,787,848 B2 | 9/2004 | Ono et al. |
| 6,919,610 B2 | 7/2005 | Saitoh |
| 6,969,657 B2 * | 11/2005 | Henson et al. .............. 438/268 |
| 2002/0185679 A1 * | 12/2002 | Baliga ........................ 257/329 |
| 2002/0195651 A1 * | 12/2002 | Miura et al. ................. 257/328 |
| 2005/0029586 A1 * | 2/2005 | Ono et al. ................... 257/330 |

FOREIGN PATENT DOCUMENTS

| | | |
|---|---|---|
| DE | 102 17 610 A1 | 11/2003 |
| DE | 102 39 312 | 3/2004 |
| EP | 1 168 455 A2 | 1/2002 |
| EP | 1 237 200 A2 | 9/2002 |
| EP | 1 267 415 A2 | 12/2002 |

* cited by examiner

FIELD EFFECT CONTROLLABLE SEMICONDUCTOR COMPONENT WITH IMPROVED INVERSE DIODE AND PRODUCTION METHODS THEREFOR

FIELD OF THE INVENTION

The present invention concerns the technical field of semiconductor components and relates, in particular, to a field effect controllable semiconductor component having an improved inverse diode, and to methods for its production.

BACKGROUND

Semiconductor components which are controllable by means of the field effect, for instance power MOSFETs (metal oxide field effect transistors), are currently produced in large numbers in industrial mass production and standardly used in technical applications. Such components have a semiconductor body with first and second doped terminal zones and a channel zone between the terminal zones, which is doped complementarily to the terminal zones. A control electrode is furthermore formed so that it is insulated from the semiconductor body, and extends between the terminal zones in the vicinity of the channel zone. In a MOSFET, the first and second terminal zones form the drain and source zones of the transistor. They are formed on opposite surfaces of the semiconductor body for a vertical structure of the semiconductor component, while in a lateral structure they are arranged on the same surface of the semiconductor body.

A particular requirement for high-voltage switches (power MOSFETs) is on the one hand to achieve a good blocking ability, while on the other hand good transmission properties are desirable. Without special precautions, however, a high blocking voltage implies weak doping and a comparatively large thickness of the voltage-absorbing layer, while good transmission properties require heavy doping and a comparatively small thickness of the active layer.

In order to accommodate especially the requirement for a high blocking voltage, a more weakly doped drift zone ("epi layer") of the same conduction type as the terminal zones, which can increase the breakdown strength, is often provided between the heavily doped first terminal zone (drain zone) and the channel zone in vertically constructed power MOSFETs, although impaired transmission properties of the switch due to the reduced charge carrier concentration must also be taken into account.

A further improvement in this regard has been provided by the development of novel high-voltage switches with a charge compensation structure, as are marketed by the Infineon Technologies AG for example under the name "CoolMOS". In this case, the two charge carrier types in the component are spatially separated from one another in the epi layer so that the net charge balances out to approximately zero in the blocking case, while unreduced (heavy) doping of one of the two charge carrier types is available for the current flow in the on state of the transistor. This novel transistor structure with charge compensation allows a drastic reduction of the on-state resistance as well as a high blocking voltage, since the two conflicting properties of blocking ability and on-state resistance are functionally decoupled from each other.

In vertical power MOSFETs with or without charge compensation, it is conventional to short circuit the terminal zone (source zone) and the channel zone. The reason for this is the fact that with non-short circuited source and channel zones, charge carriers can accumulate in the channel zone during operation and can activate the parasitic bipolar transistor of the MOSFET, which is always present owing to the sequence of differently doped zones, the consequence of which is that the voltage strength of the component can be impaired. Since the short circuited source and channel zones are at the same potential, charge carriers cannot accumulate in the channel zone so that the parasitic bipolar transistor cannot be activated under normal operating conditions.

Short circuiting the source and channel zones, however, creates an (inverse) diode (comprising the channel zone and the drift or second terminal zone), which can block only in the forward direction (usually the drain-source current direction) of the transistor, while it conducts in the reverse direction (usually the source-drain current direction). This diode can be utilized, and acts as a freewheel diode in many power electronic applications.

If the MOSFET is to be optimized in respect of its properties as the best possible power switch, then the properties of the inverse diode can conflict with this. A limitation of the switching frequency arises, for example, the cause of which usually involves chopping of the reverse current of the inverse diode. Such chopping of the reverse current is associated with high current rates of change (di/dt) and can particularly detrimentally lead to overvoltages in conjunction with the e.g. parasitic inductances which are always present. This may cause oscillations in the drain-source voltage or the anode current, which impair the electromagnetic compatibility (EMC) of the switch or even destroy it in the most unfavorable case when the blocking ability is exceeded.

In order to resolve this problem, it has been proposed to reduced the charge carrier lifetime in the semiconductor switch by exposure to high-energy particle radiation (see, for example, "M. Schmitt, H.-J. Schulze, A. Schlögl, M. Vosseburger, A. Willmeroth, G. Deboy and G. Wachutka. A Comparison of Electron, Proton and Helium Ion Irradiation for the Optimization of the CoolMOS Body Diode, Proc. ISPSD, Santa Fe, 2002"). A reduction of the charge carrier lifetime can be carried out homogeneously over the component in this case, for example by irradiating it with electrons. The irradiation generates recombination centers in the component, which promote the recombination of charge carriers of opposite charge carrier types. The charge stored in the inverse diode can be reduced by the increased recombination rate, so that smaller switching losses are entailed and the reverse current peak can be significantly decreased in its magnitude. As a result, chopping of the reverse current leads to reduced-amplitude oscillations of the drain-source voltage, or the anode current.

A similar effect as by exposing the component to high-energy particle radiation can be achieved by diffusing metals, such as platinum or gold, into the component.

However, homogeneous charge carrier reductions can exert only little influence on the charge carrier distribution at the start of switching off. As shown in "J. Lutz, Freilaufdioden für schnell schaltende Anwendungen [freewheel diodes for fast-switching applications], dissertation TU Illmenau, Verlag ILSE, 2000", to achieve a reverse current profile without chopping because of the different charge carrier mobilities, it is essential to produce a charge carrier distribution in the component which comprises a lower charge carrier density on the anode side than on the cathode side. To this end, either the doping of the channel zone (usually p-type doping) must be lowered in order to reduce the emitter efficiency of the anode of the diode, or the charge carrier lifetime must be locally reduced at this position, for example by helium irradiation. The former variant, however, always leads to an undesirable change in the properties of the MOSFET switch, while the latter variant entails significantly increased costs. Furthermore, in contrast to electron irradiation, the wafers cannot be stacked on one another for this process.

In another proposed solution, Schottky diodes are produced inside the semiconductor switch (see D. Calafut. Trench Power MOSFET Lowside Switch with Optimized Integrated Schottky Diode, Proc. ISPSD, Kitakyushu 2004). Such integration of Schottky diodes into the structure on the one hand allows very good properties of the inverse diode, but on the other hand also leads to a reduction of the active switch area and therefore to less effective utilization of the silicon surface. Furthermore, especially with high blocking voltages, care must be taken that the blocking current does not rise excessively.

SUMMARY

In relation to this, it is an object of the present invention to provide a field effect controllable semiconductor component having an improved inverse diode and production methods therefor. Such a semiconductor component should, in particular, be capable of reducing reverse current losses and avoiding premature avalanche breakdown, chopping of the reverse current of the inverse diode and oscillations of the drain-source voltage or the anode current, but without having to tolerate the disadvantages of the aforementioned solutions known in the prior art.

Laid-open German specification DE 102 17 610 A1 describes a semiconductor component with a semiconductor body having a first terminal zone, a channel zone, a drift zone between the channel zone and the first terminal zone, a control electrode formed so that it is insulated from the channel zone for controlling a conductive channel in the channel zone, and a field stop zone formed between the first terminal zone and the drift zone. The terminal zone corresponding to the source is not short circuited with the channel zone, so as to avoid the formation of an inverse diode.

This object is achieved by a field effect controllable semiconductor component having an improved inverse diode, and methods for its production, having the features of embodiments of the invention.

Accordingly, at least some embodiments of the invention relate to a field effect controllable semiconductor component which, in the conventional way, comprises a semiconductor body having a first and a second terminal zone of a first conduction type (n), a channel zone of a second conduction type (p), which is short circuited with the second terminal zone, and a drift zone of the first conduction type (n) with weaker doping than the first and second terminal zones. The drift zone is in this case formed between the channel zone and the first terminal zone, the channel zone being formed between the drift zone and the second terminal zone. The semiconductor component furthermore comprises a control electrode formed so that it is insulated from the channel zone, for controlling a conductive channel in the channel zone between the second terminal zone and the drift zone.

According to the present invention, the semiconductor component having the above features furthermore comprises a doped zone of the first conduction type (n), formed between the first terminal zone and the drift zone, which is advantageous as this doped zone has heavier doping than the drift zone while it has weaker doping than the first terminal zone. For easier reference, this doped zone will be referred to below as a "field stop zone", this term being motivated by the special function of this doped zone.

The semiconductor component according to the invention is preferably embodied in a vertical structure as a power switch (high-voltage switch). The semiconductor body of the semiconductor component is furthermore preferably constructed from a semiconductor substrate which, for example, consists of silicon, germanium, gallium arsenide or another semiconductor with heavy doping, i.e. a high dopant concentration which, for example, is of the order of from $1 \times 10^{19}/cm^3$ to a few $10^{19}/cm^3$, and a semiconductor layer ("epi layer") applied thereon typically by epitaxial growth with weaker doping, i.e. a lower dopant concentration, the doping or dopant concentration of which is, for example, of the order of from $1 \times 10^{15}/cm^3$ to a few $10^{15}/cm^3$.

The effect of the field stop zone structural element according to the invention is advantageously, on the one hand, that additional charge carriers are delivered at the end of the switch-off process and counteract the reverse current chopping, and on the other hand this field stop zone essentially acts as a field stop which optimizes the field distribution in dynamic switching processes.

The occurrence of the typical second field peak encountered with high current densities in the transition region between the first terminal zone and the drift zone is therefore abated in its effects, since the extent of the space charge zone is increased in the region of the second field peak and the height of the second field peak is thus reduced. Expressed qualitatively, the doping of the field stop zone on the one hand should not be too weak to induce a sufficiently large effect, but on the other hand the doping of the field stop zone should not be too heavy and the gradient of the doping profile should not be too great, so that the second field peak is effectively reduced. The gradient of the doping profile of the stop zone should however not be too high, so that the reduction of the field peak is effective over a sufficiently wide range of current densities which can occur during the switch-off process; that is to say the partial compensation or even the local overcompensation of increased electron densities, which can occur in the drift zone in the region of the transition into the first terminal zone, should be effective for a sufficiently wide range of electron concentrations. Doping of the field stop zone which is advantageous in this regard is then selected so that the maximum doping (maximum value of the doping) of the field stop zone is at most a factor of about $10^2$ heavier than the doping of the drift zone, that is to say the doping of the field stop zone (maximum value) lies in a range which is given by the doping of the drift zone and at most about $10^2$ times the doping of the drift zone. It is more preferable for the maximum doping (maximum value of the doping) of the field stop zone to be at most a factor of about 10 heavier than the doping of the drift zone, that is to say the doping of the field stop zone lies in a range which is given by the doping of the drift zone and at most about 10 times the doping of the drift zone.

Expressed in absolute values, for a (Si) substrate whose doping for example with antimony is typically from $1 \times 10^9/cm^3$ to a few $10^{19}/cm^3$, and an epi layer likewise doped for example with arsenic or antimony whose doping is typically from $1 \times 10^{15}/cm^3$ to a few $10^{15}/cm^3$, the doping of the field stop layer for example with phosphorus is preferably at most from $1 \times 10^{17}/cm^3$ to a few $10^{17}/cm^3$, or more preferably at most from $1 \times 10^{16}/cm^3$ to a few $10^{16}/cm^3$. The doping of the field stop zone thus preferably lies in a range whose lower limit is given by the basic doping, that is to say from $1 \times 10^{15}/cm^3$ to a few $10^{15}/cm^3$, and whose upper limit is given by from $1 \times 10^{17}/cm^3$ to a few $10^{17}/cm^3$, or more preferably lies in range whose lower limit is given by from $1 \times 10^{15}/cm^3$ to a few $10^{15}/cm^3$, and whose upper limit is given by from $1 \times 10^{16}/cm^3$ to a few $10^{16}/cm^3$.

In general, the dopant concentration of the field stop zone does not have a constant value in its interior and furthermore makes no jumps in the dopant concentration at its edge toward the adjacent layers. Rather, the field stop zone has transition regions in which the dopant concentration of the field stop zone merges continuously into the dopant concentration of the drift zone or the first terminal zone. In an inner region of the field stop zone, that is to say the region without these transition regions where the dopant concentration merges continuously into the adjacent dopant concentrations, the dopant concentration generally increases continuously in a spatial direction from the drift zone toward the first terminal zone. The above specifications for the maximum doping (dopant concentration) in the field stop zone thus relate to this inner region of the field stop zone without taking into account the adjacent transition regions, and apply up to a point of the doping profile as measured along a shortest linear dimension between the drift zone and the first terminal zone which lies immediately before the transition of the inner region into the first terminal zone.

The doping profile in the inner region of the field stop zone along a shortest linear dimension between the drift zone and the first terminal zone may in this case comprise a multiplicity of stepped, rounded plateaus and may particularly be formed in 1 or 2 stages. With a 1-stage configuration of the doping profile of the field stop zone, starting with the dopant concentration of the field stop zone the dopant concentration first increases continuously along a shortest linear dimension between the drift zone and the first terminal zone in the direction of the first terminal zone (transition region), then flattens out (inner region) and then increases again upon reaching the aforementioned point (transition region) in order to merge continuously into the dopant concentration of the first terminal zone. The rounded, stepped plateau(s) may, for example, correspond to one or more Gaussian profiles.

In order to avoid an excessive decrease of the field for the aforementioned regions, it is furthermore preferable for the gradient of a doping profile of the field stop zone along a shortest linear dimension between the drift zone and the first terminal zone to decrease to less than 30%, in particular less than 10%, of a maximum value of the field stop doping in the direction of the drift zone.

Particularly in connection with the specific indications for the size of the gradient of the doping profile of the field stop zone as given above, it is preferable for the field stop zone to have a thickness in the range of from about 1 to about 10 µm along a shortest linear dimension between the drift zone and the first terminal zone, it being even more preferable for it to have a thickness in the range of from about 1 to about 5 µm.

For doping the field stop zone, it is preferable to use a dopant which has a higher diffusion coefficient than a dopant of the first terminal zone. When a (Si) substrate is doped with antimony, this may in particular be phosphorus and/or arsenic. When a (Si) substrate is doped with antimony and/or arsenic, this may in particular be phosphorus. For a multistage configuration of the doping profile of the field stop zone, it may be doped with a multiplicity of different dopants.

In a preferred configuration of the semiconductor component according to the invention, the semiconductor body may also be provided with at least one recombination zone for promoting the recombination of charge carriers of the first and second conduction types, in order to reduce the amount of charge stored in the inverse diode. In particular, a homogeneous (non-local) reduction of the charge carrier lifetime may be used, in which case a comparatively cost-intensive local reduction of the charge carrier lifetime can be obviated. Such a recombination zone for promoting the recombination of charge carriers of the first and second conduction types may in this case be produced by diffusing in recombination centers in the form of metals, particularly platinum or gold. Alternatively, the semiconductor component may be exposed to energetic particle radiation such as electrons or, for the case of a local reduction of the carrier lifetime, protons or $He^{2+}$ ions in order to generate lattice defects which act as recombination centers.

In another advantageous configuration of the semiconductor component according to the invention, it is additionally provided with at least one charge compensation structure in order to compensate for complementary charge carriers, particularly in the drift zone.

The semiconductor component according to the invention is preferably a vertical power MOSFET (high-voltage switch) A lateral power MOSFET may nevertheless also be used.

Several methods for producing a semiconductor component according to the invention as described above are furthermore described.

In a first method, a semiconductor substrate of a first conduction type (n) is provided, which is doped with at least one first dopant having a first dopant concentration. The semiconductor substrate is generally doped so heavily that it forms overall a first terminal zone, although it is in principle also possible for the first terminal zone to form a more heavily doped region inside the more weakly doped semiconductor substrate. At least one second dopant, of the same charge carrier type as the first dopant used for doping the semiconductor substrate, is subsequently introduced (generally implanted) on a surface of the semiconductor substrate. What is essential here is that the second dopant is selected so that it has a higher diffusion coefficient in the semiconductor substrate than the first dopant of the semiconductor substrate. A semiconductor layer of the first conduction type (n), doped with at least one third dopant, is then applied on the surface of the semiconductor substrate in which the second dopant has been introduced, which is generally done by epitaxial growth (epi layer). The third dopant is present in the semiconductor layer with a third dopant concentration, which is adjusted so that it is less than the first dopant concentration of the first dopant of the semiconductor substrate. A channel zone of the second conduction type (p) is subsequently produced and a second terminal zone of the first conduction type (n), arranged next to the channel zone and doped with at least one fourth dopant having a fourth dopant concentration, is produced. The fourth dopant concentration is in this case adjusted so that it is greater than the third dopant concentration of the semiconductor layer (epi layer). What is essential for the method according to the invention is that the temperature of the semiconductor substrate is increased so as to cause diffusion of the second dopant out of the semiconductor substrate into the applied semiconductor layer (epi layer), in order to generate a field stop layer. A separate temperature rise is generally and typically not necessary for this, since the subsequent processes for producing the component in any case employ a sufficient number of high-temperature processes which allow diffusion of the second dopant out into the semiconductor layer (epi layer). If need be, however, an additional high-temperature step may nevertheless be used for diffusing the second dopant out, specifically for example after the epitaxial deposition. The semiconductor substrate itself should not in this case diffuse out too much, since otherwise the field stop zone doping profile generated would be greatly modified. The semiconductor substrate must accordingly be doped with a (first) dopant which has a (preferably much) lower diffusion constant (diffusion coefficient) than the (second) dopant of the field stop zone. The semiconductor substrate may accordingly be doped for example with arsenic or antimony, in which for example phosphorus atoms are implanted in order to generate the field stop zone by subsequent outward diffusion, because arsenic and antimony have a much lower diffusion constant compared with phosphorus in a substrate of, for example, silicon. If the substrate were doped with phosphorus, the field stop zone formed by outward diffusion of the implanted phosphorus atoms would lie in the n-doped zone which has been generated by outward diffusion of the phosphorus substrate, and therefore covered. This would in turn lead to heavy doping of the field stop zone which, however, is undesirable since as mentioned above the doping of the field stop zone should not be too heavy in order to be able to effectively abate the second field peak. In the method according to the invention, therefore, implantation of phosphorus and/or arsenic is thus carried out in a (Si) substrate doped with antimony.

The doping profile and the thickness of the field stop zone generated by outward diffusion of the second dopant can be adjusted on the one hand via the temperature and the duration of the temperature rise, as well as via the selection of the implantation energy of the second dopant, and also via the selection of the implantation dose at the starting point of the doping. Very good adaptability of the field stop zone is therefore provided. The important steady-state breakdown voltage of the MOSFET is lowered only slightly with suitable dimensioning of the field stop zone, and likewise the on-state resistance $R_{ON}$. A typical implantation dose at the starting point of the doping is in this case in the range of from a few $10^{12}/cm^3$ to a about $1\times10^{15}/cm^3$.

In a second method for producing a semiconductor component according to the invention as explained above, a semiconductor substrate of the first conduction type. (n), which is doped with at least one first dopant having a first dopant concentration, is initially provided in order to form a first terminal zone. The semiconductor substrate is doped so heavily that it can be used overall as a first terminal zone, although as an alternative to this it is also possible to provide a more heavily doped first terminal zone in a more weakly doped semiconductor substrate. A first dopant is subsequently implanted on a surface of the semiconductor substrate, a sufficiently high implantation dose being used so as to generate an increased density of vacancies in the semiconductor substrate. The first dopant is typically implanted with an implantation dose of at least $1\times10^{16}/cm^3$, and preferably $5\times10^{16}$-$10^{17}$, on the surface of the semiconductor substrate. A doped semiconductor layer of the first conduction type (n), which is doped with at least one third dopant having a third dopant concentration, is subsequently applied on the surface of the semiconductor substrate in which the ion implantation with a heavy dose has been carried out, which is generally done by epitaxial growth (epi layer). The third dopant concentration is in this case less than the first dopant concentration of the first dopant of the semiconductor substrate. A channel zone of the second conduction type (p) is then produced and, arranged next to the channel zone, a second terminal zone of the first conduction type (n) is produced which is doped with at least one fourth dopant having a fourth dopant concentration. The fourth dopant concentration is in this case greater than the third dopant concentration of the semiconductor layer. In order to cause diffusion of the first dopant out of the semiconductor substrate into the applied semiconductor layer so as to generate a field stop layer—as already mentioned in the method described above—a separate temperature rise is generally and typically not necessary for this, since the subsequent processes for producing the component in any case employ a sufficient number of high-temperature processes which allow diffusion of the second dopant out into the semiconductor layer (epi layer). In a particularly preferred configuration of the method according to the invention, the first dopant and the second dopant are phosphorus, that is to say phosphorus is implanted with a high dose in a phosphorus-doped (Si) substrate in order to generate vacancies. With predetermined subsequent high-temperature steps, the depth of the field stop zone can be influenced via the phosphorus implantation energy.

The method according to the invention described above uses a so-called "autodoping effect". An increased density of vacancies in the substrate, doped in particular with phosphorus, then leads to the formation of phosphorus vacancy pairs in the region of the surface of the substrate with a significantly reduced diffusion rate. Deeper in the (Si) substrate (i.e. also in the epitaxially applied material) however, an increased concentration of interstitial silicon atoms causes an increase in the diffusion rate and therefore the so-called phosphorus tail.

The above-described second method of the invention may in principle be combined with the above-described first method of the invention. To this end at least one second dopant, of the same charge carrier type as the first dopant, is additionally introduced (generally implanted) on a surface of the semiconductor substrate, the second dopant having a higher diffusion coefficient in the semiconductor substrate than the first dopant of the semiconductor substrate. The temperature of the semiconductor substrate is subsequently increased so as to cause diffusion of the second dopant out of the semiconductor substrate into the applied semiconductor layer in order to generate a field stop zone, which is typically done by subsequent high-temperature processing steps, that is to say without an additional separate temperature increase step.

In a third method for producing a semiconductor component according to the invention as explained above, a semiconductor substrate of the first conduction type (n) doped with at least one first dopant having a first dopant concentration, which is used overall as a first terminal zone or in which a more heavily doped first terminal zone is alternatively formed in a more weakly doped substrate, is initially provided. A semiconductor layer of the first conduction type (n) is subsequently applied generally by epitaxy (epi layer) on the substrate, the semiconductor layer being doped with at least one third dopant having a third dopant concentration and the third dopant concentration being less than the first dopant concentration of the first dopant of the semiconductor substrate. A channel zone of the second conduction type (p) is then produced and, arranged next to the channel zone, a second terminal zone of the first conduction type (n) is produced which is doped with a fourth dopant having a fourth dopant concentration, the fourth dopant concentration being greater than the third dopant concentration of the semiconductor layer. The temperature of the semiconductor substrate is lastly increased so as to cause diffusion of the first dopant out of the semiconductor substrate into the applied semiconductor layer in order to generate a field stop layer, for which purpose a separate temperature rise is not generally carried out but instead subsequent high-temperature processes during the production of the semiconductor component are employed. The first dopant is preferably phosphorus.

In all the methods, it may be advantageous to provide a further step in order to produce a compensation structure for charge compensation in the semiconductor layer applied on the semiconductor substrate.

Likewise, in all the methods it may be advantageous to provide a further step in order to produce at least one compensation recombination zone for promoting the recombination of charge carriers of a first and second charge carrier type. Such production of a recombination zone may in particular be carried out by exposing the component, or particularly the semiconductor layer grown on the semiconductor substrate, to energetic particle radiation, the radiation energy being selected so that defects are thereby generated as recombination centers in the lattice. Irradiation may, for example, be carried out with electrons, protons or He$^{++}$ ions. As an alternative to this recombination promoting substances, in particular metals such as platinum or gold, may be introduced (for example by implantation and diffusion) particularly into the semiconductor layer grown on the semiconductor substrate in order to produce a recombination zone.

The invention will now be explained in more detail with the aid of exemplary embodiments, reference being made to the appended drawings. Elements which are the same or have the same effect are provided with the same reference numerals in the drawings.

DETAILED DESCRIPTION

Figure 1A:
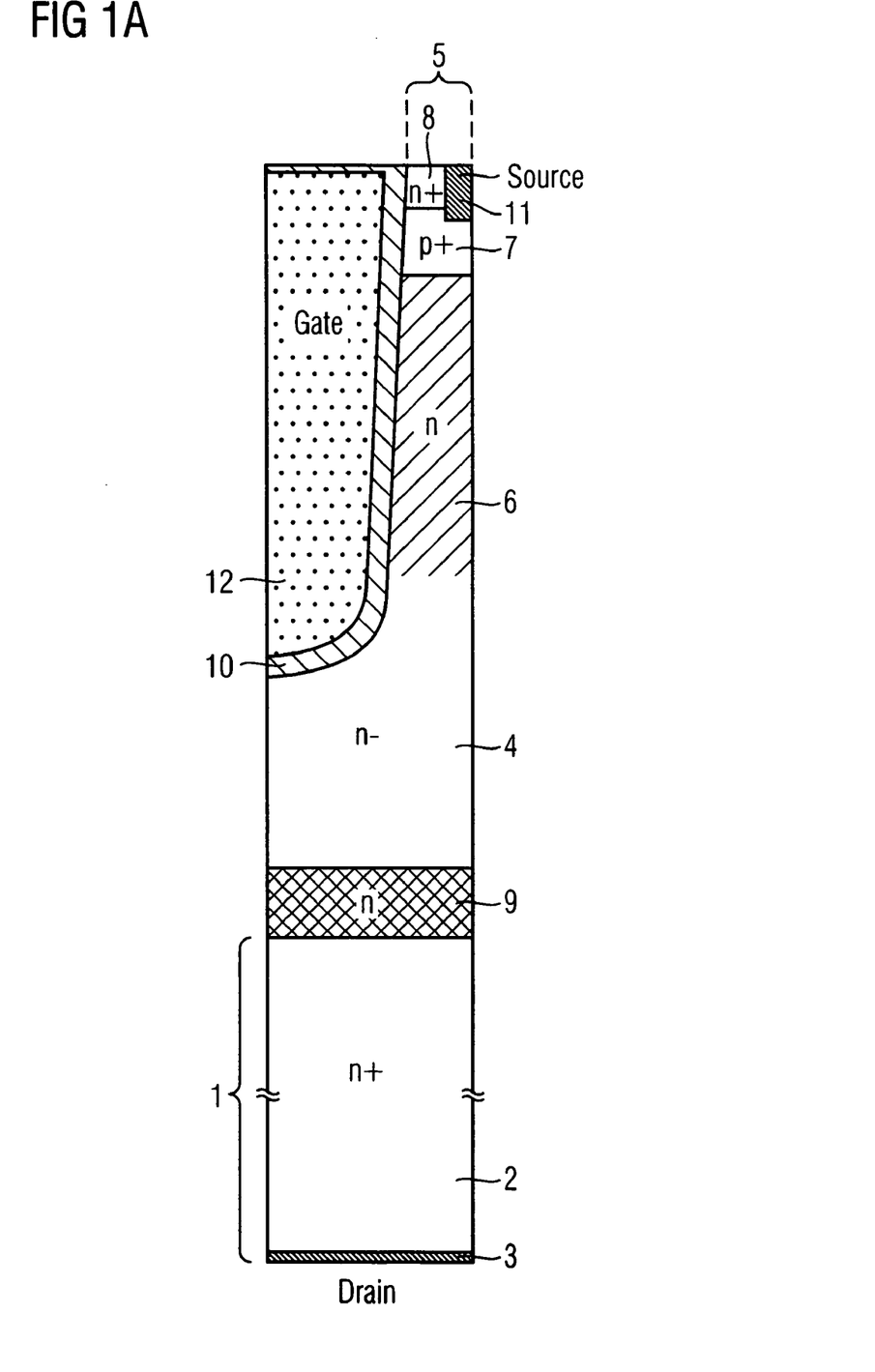
FIG. 1A schematically shows a vertical section through a first embodiment of a vertical power MOSFET according to the invention with a compensation structure.
Figure 1B:
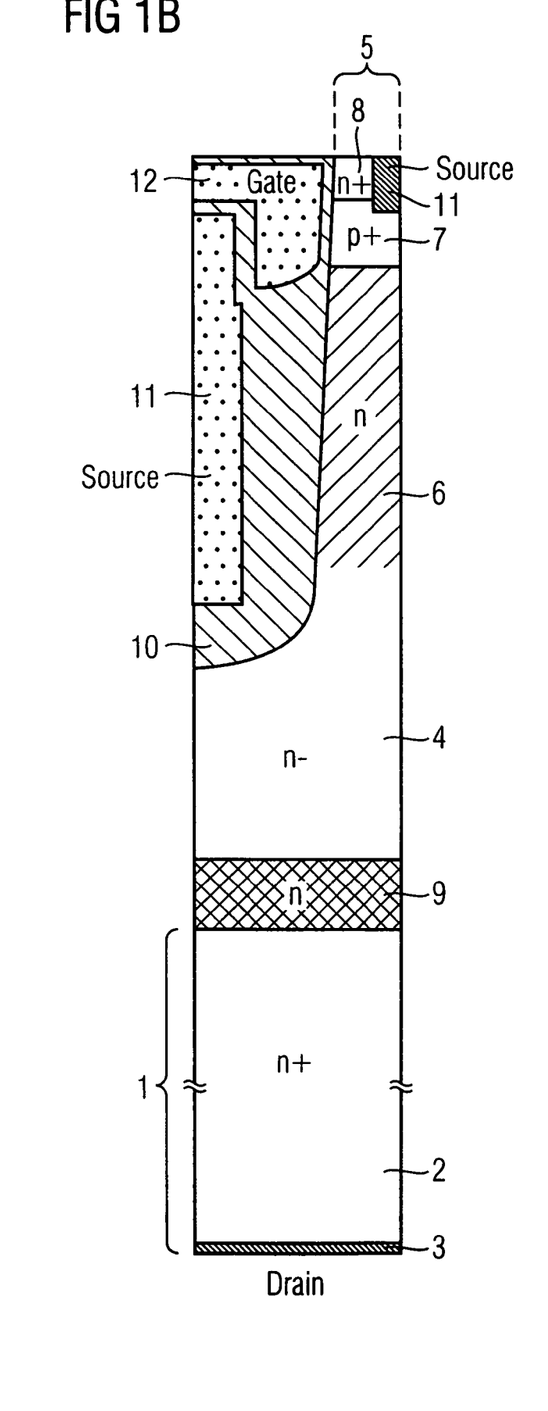
FIG. 1B schematically shows a vertical section through a second embodiment of a vertical power MOSFET according to the invention with a compensation structure.

FIGS. 1A and 1B schematically represent sections of various embodiments of vertical power MOSFETs according to the invention with a field stop zone and a charge carrier compensation structure. On a Si semiconductor substrate 2 heavily n$^+$-doped for example with antimony, a Si epi layer 4 (drift zone) weakly n$^-$-doped for example with phosphorus or arsenic is accordingly deposited by means of epitaxy. The heavily n$^+$-doped Si semiconductor substrate 2 together with a drain metallization 3 forms a first terminal zone 1. A channel zone 7 heavily p$^+$-doped for example with boron and a zone 8 heavily n$^+$-doped for example with phosphorus or arsenic are also formed. The heavily n$^+$-doped zone 8 together with a source metallization 11 forms a second terminal zone 5. The epi layer 4 (drift zone) is in this case formed between the channel zone 7 and the first terminal zone 1, while the channel zone 7 is formed between the drift zone 4 and the second terminal zone 5. A compensation zone 6 n$^-$-doped for example with phosphorus is also formed in the epi layer 4. A control electrode (gate) 12 insulated from the channel zone 7 and the compensation zone 6 is provided, which controls a conductive channel in the channel zone 7 by means of the field effect. An insulating zone 10 of for example silicon dioxide is formed in order to insulate the control electrode 12 from the channel zone 7 and the compensation zone 6.

In FIG. 1A, the control electrode 12 is also used for the charge compensation of the compensation zone 6, so that the control electrode 12 and the compensation zone 6 together form a compensation structure. In contrast to this, in FIG. 1B the source metallization 11 is used for the charge compensation of the compensation zone 6, so that the source metallization 11 and the compensation zone 6 together form a compensation structure. The two different embodiments of FIG. 1A and FIG. 1B differ merely by the design of the compensation structure.

As an essential feature of the invention in the two embodiments of FIG. 1A and FIG. 1B, a field stop zone 9 n-doped for example with phosphorus or arsenic is formed between the epi layer 4 and the first terminal zone 1. The field stop zone 9 has heavier doping than the epi layer 4, while it has weaker doping than the first terminal zone 1.

In the two embodiments, the source metallization 11 makes contact with both the heavily n$^+$-doped zone 8 and the heavily p$^+$-doped channel zone 7, so that an inverse diode is created by the heavily p$^+$-doped channel zone 7, the weakly n$^-$-doped Si epi layer 4 (drift zone), the n-doped field stop zone 9 and the first terminal zone 1.

Figure 1C:
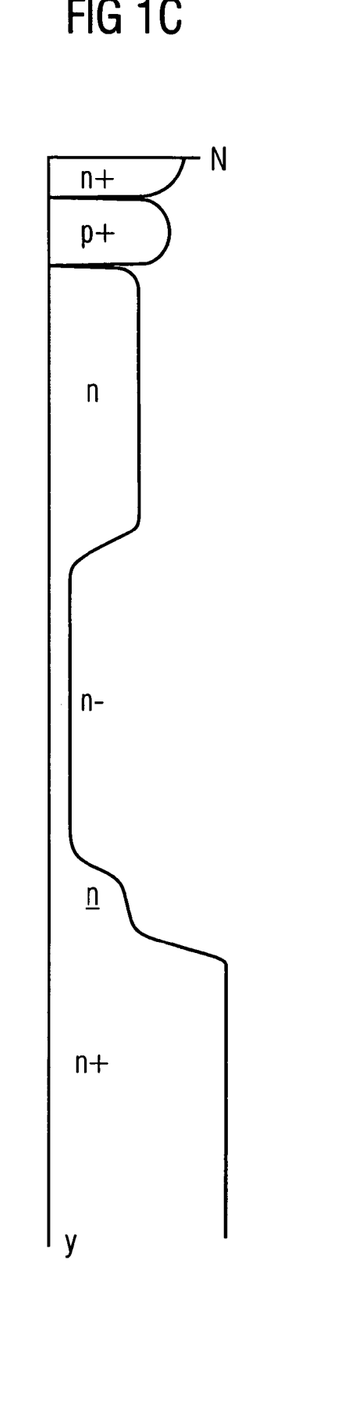
FIG. 1C shows a doping profile along a source to drain direction of the embodiments in FIGS. 1A and 1B.

The special doping profile of the two embodiments of FIGS. 1A and 1B in a vertical direction y of the MOSFET from the source to the drain can be seen in FIG. 1C. A source to drain direction is indicated by the abscissa y in FIG. IC, while a dopant concentration N is plotted as the ordinate. With an increase in value of y, a heavily n$^+$-doped doped zone 8 as part of the second terminal zone 5, which for example has a doping concentration of about $10^{19}$-$10^{20}$/cm$^3$, merges into a heavily p$^+$-doped channel zone 7 which, for example, has a dopant concentration of about $10^{17}$/cm$^3$. The compensation zone 6 has a dopant concentration of for example about $10^{16}$/cm$^3$ that merges into the dopant concentration of the epi layer 4, which is for example a few $10^{15}$/cm$^3$. Next, a continuous rise in the dopant concentration can be seen -n the field stop zone 9, forming a flat step whose maximum value at the continuous transition into the dopant concentration of the Si substrate 2 is for example a few $10^{17}$/cm$^3$. The doping concentration of the Si substrate is for example a few $10^{19}$/cm$^3$. The flattened step of the doping profile in the field stop zone 9 defines its inner region while the steeper transitions, on the one hand coming from the doping concentration of the epi layer and on the other hand into the dopant concentration of the Si substrate 2, define transition regions of the field stop zone 9.

The two embodiments of FIG. 1A and FIG. 1B are produced, for example, by a method in which the Si substrate 2 n$^+$-doped for instance with antimony is initially provided, and a first terminal zone 1 is produced in conjunction with the drain metallization 3. Arsenic or phosphorus, for example, is subsequently implanted in the Si substrate 2, for which purpose an implantation dose in the range of from a few $10^{12}$/cm$^3$ to $1 \times 10^{15}$/cm$^3$ may be used on the surface of the semiconductor substrate. A Si epi layer 4 doped for instance with phosphorus is then grown by epitaxy on the surface of the Si substrate 2, the dopant concentration of the epi layer 4 being less than the dopant concentration of the semiconductor substrate 2. This is followed by production of the compensation zone 6 by implanting phosphorous, for example, and diffusing it into the epi layer 4 and production of the heavily p$^+$-doped channel zone 7 as well as, in conjunction with the source metallization 11, the second terminal zone 5. A control electrode 12 insulated from the channel zone 7 and the compensation zone 6 is formed in order to fabricate the compensation structure in FIG. 1A, while in FIG. 1B a further source electrode 11, insulated from the channel zone 7 and the compensation structure 6, is formed besides a control electrode 12 in order to fabricate the compensation structure. High-temperature processes during the fabrication of the MOSFET are generally employed so as to cause diffusion of the dopant implanted in the Si substrate 2 out into the epi layer 4 in order to generate a field stop layer 9, without providing a separate temperature rise. If need be, however, an additional high-temperature step may nevertheless be used for the outward diffusion—for example after deposition of the epitaxial layer.

Figure 2A:
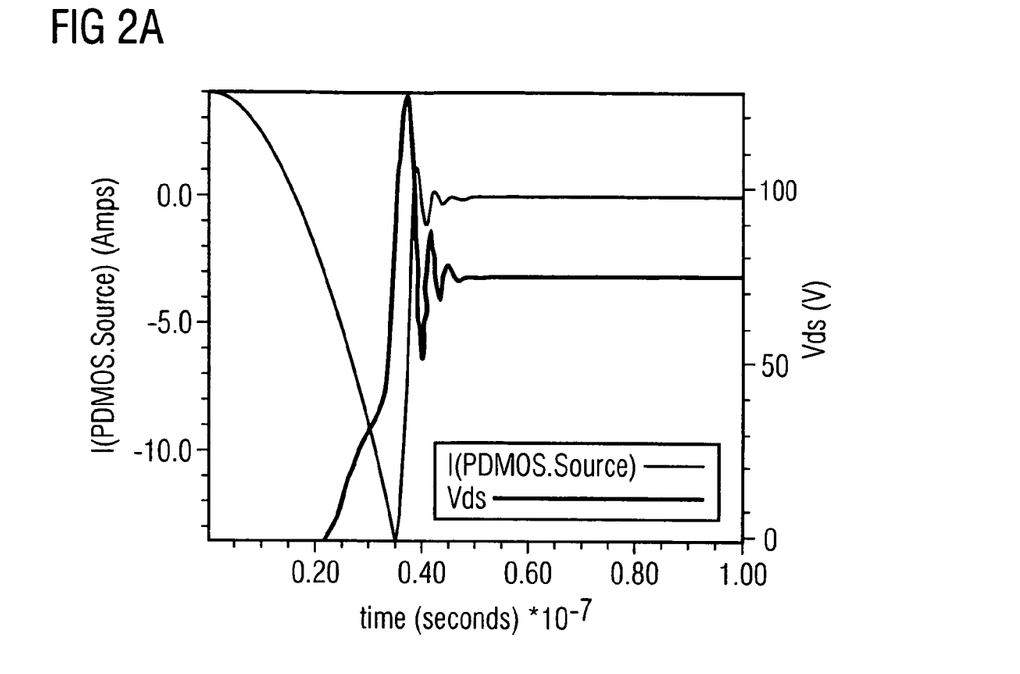
FIG. 2A shows the results of a mixed mode simulation in a conventional vertical power MOSFET without a field stop zone.
Figure 2B:
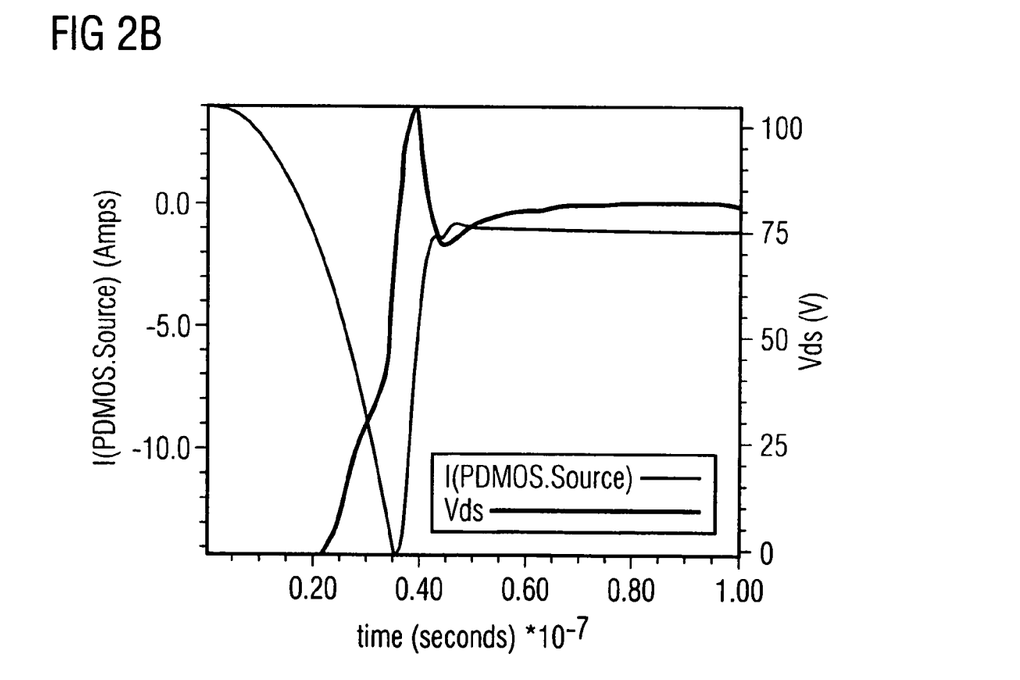
FIG. 2B shows the results of a mixed mode simulation in a vertical power MOSFET according to the invention with a field stop zone.

Reference will now be made to FIGS. 2A and 2B, which show the result of a mixed mode simulation in a conventional vertical 150 V power MOSFET without a field stop zone 9 (FIG. 2A) and in a vertical power MOSFET according to the invention with a field stop zone 9 (FIG. 2B), as represented in FIGS. 1A and 1B. in FIGS. 2A, 2B, a drain current (anode current) I and a drain-source voltage $V_{DS}$ (emboldened in the figures) are plotted against the simulation time. As special parameters of the simulation, $V_R$=75 V, $I_F$=4 A/mm² and di/dt=500 A/µs were selected. Parasitic inductances were taken into account.

As can be seen by comparing FIGS. 2A and 2B, large fluctuations of both the drain current I and the drain-source voltage $V_{DS}$ occur when the inverse diode of the conventional MOSFET is switched off, and also in particular a strong overshoot of the drain-source voltage $V_{DS}$. Such fluctuations virtually no longer exist in the MOSFET according to the invention. The strong overshoot of the drain-source voltage $V_{DS}$ is likewise reduced. It can furthermore be observed that, after a steep rise which takes place up to about 0.40×10⁻⁷ seconds, the drain current I in the MOSFET according to the invention no longer falls off as steeply as in the conventional case, which counteracts detrimental chopping of the reverse current.

The present invention shows how the properties of the inverse diode can be improved simply by producing a field stop zone in any (vertical) MOS power components. This can be done by implanting a rapidly doping dopant such as phosphorus in a substrate which is doped with more slowly doping substances such as arsenic or antimony, before the weakly doped epitaxial layer necessary for sustaining the required control voltage is deposited on the substrate. The field stop zone is then automatically formed by diffusion during the subsequent processing of the component.

As discussed further above at least some advantages of embodiments of the invention may be obtained regardless of whether the semiconductor component has a vertical structure or a lateral structure.

The invention claimed is:

1. A semiconductor component, comprising:
   a semiconductor body having a semiconductor substrate and a doped semiconductor layer provided on the semiconductor substrate, the semiconductor substrate having a first terminal zone of a first conduction type and the doped semiconductor layer having a second terminal zone of the first conduction type,
   a channel zone of a second conduction type short circuited with the second terminal zone,
   a drift zone of the first conduction type having a doping which is weaker than those of the terminal zones, the drift zone being disposed between the channel zone and the first terminal zone, and the channel zone being disposed between the drift zone and the second terminal zone,
   a control electrode insulated from the channel zone for controlling a conduction channel in the channel zone between the second terminal zone and the drift zone,
   a compensation structure for charge compensation, the compensation structure comprising a compensation zone between the drift zone and the channel zone, and
   a field stop zone of the first conduction type disposed between the first terminal zone and the drift zone, the field stop zone having heavier doping than the drift zone and a weaker doping than the first terminal zone, a maximum doping concentration of the field stop zone being at most a factor of about 10² greater than a doping concentration of the drift zone, wherein
   the field stop zone has a doping between 1×10¹⁵ cm⁻³ and a few 10¹⁷ cm⁻³ and has a thickness in the range of from about 1 to about 10 µm along a shortest linear dimension between the drift zone and the first terminal zone,
   the drift zone extends between the compensation zone and the field stop zone, and
   the drift zone has a constant doping concentration between the compensation zone and the field stop zone.

2. The semiconductor component as claimed in claim 1, wherein the doping of the field stop zone is at most a factor of about 10 heavier than the doping of the drift zone.

3. The semiconductor component as claimed in claim 2, wherein the maximum doping concentration of the field stop zone is at most 10¹⁷ cm⁻³.

4. The semiconductor component as claimed in claim 2, wherein the maximum doping concentration of the field stop zone is on the order of 10¹⁶ cm⁻³.

5. The semiconductor component as claimed in claim 1, wherein a gradient of a doping profile of the field stop zone along a shortest linear dimension between the drift zone and the first terminal zone decreases to less than 30% of the maximum doping concentration of the field stop zone in the direction of the drift zone.

6. The semiconductor component as claimed in claim 5, wherein a gradient of a doping profile of the field stop zone along a shortest linear dimension between the drift zone and the first terminal zone decreases to less than 10% of a maximum doping concentration of the field stop zone in the direction of the drift zone.

7. The semiconductor component as claimed in claim 1, wherein the field stop zone has a thickness in the range of from about 1 to about 10 µm along a shortest linear dimension between the drift zone and the first terminal zone.

8. The semiconductor component as claimed in claim 1, wherein the field stop zone has a thickness in the range of from about 1 to about 5 µm along a shortest linear dimension between the drift zone and the first terminal zone.

9. The semiconductor component as claimed in claim 1, wherein the field stop zone is doped with a dopant having a higher diffusion coefficient than a dopant of the first terminal zone.

10. The semiconductor component as claimed claim 9, wherein the dopant of the field stop zone is selected from the group consisting of phosphorus and arsenic.

11. The semiconductor component as claimed in claim 1, wherein the semiconductor body includes at least one recombination zone for promoting the recombination of charge carriers of the first and second conduction types.

12. The semiconductor component as claimed in claim 11, wherein the at least one recombination zone is provided with metal atoms.

13. The semiconductor component as claimed in claim 11, wherein the at least one recombination zone is generated by exposure of at least some of the semiconductor body to high-energy radiation.

14. The semiconductor component as claimed in claim 1, wherein a doping profile of the field stop zone along a shortest linear dimension between the drift zone and the first terminal zone has a multiplicity of rounded, stepped plateaus.

15. The semiconductor component as claimed in claim 14, wherein the doping profile of the field stop zone along a shortest linear dimension between the drift zone and the first terminal zone is formed in two stages.

16. The semiconductor component as claimed in claim 14, wherein the doping profile of the field stop zone is doped with a multiplicity of dopants.

17. The semiconductor component as claimed in claim 1, further comprising at least one compensation structure for charge compensation in the drift zone.

18. A semiconductor component, comprising:
- a semiconductor body having a first terminal zone of a first conduction type and a second terminal zone of the first conduction type,
- a channel zone of a second conduction type short circuited with the second terminal zone,
- a drift zone of the first conduction type with weaker doping than the terminal zones, the drift zone disposed between the channel zone and the first terminal zone, the channel zone disposed between the drift zone and the second terminal zone,
- a control electrode insulated from the channel zone, and
- a field stop zone of the first conduction type disposed between the first terminal zone and the drift zone, the field stop zone having a heavier doping than the drift zone, a weaker doping than the first terminal zone, and a thickness in the range of from about 1 to about 10 μm along a shortest linear dimension between the drift zone and the first terminal zone.

19. The semiconductor component as claimed in claim 18, wherein a gradient of a doping profile of the field stop zone along a shortest linear dimension between the drift zone and the first terminal zone decreases to less than 30% of a maximum doping concentration of the field stop zone in the direction of the drift zone.

20. The semiconductor component as claimed in claim 18, wherein the field stop zone is doped with a dopant having a higher diffusion coefficient than a dopant of the first terminal zone.

21. The semiconductor component as claimed in claim 18, wherein the semiconductor body includes at least one recombination zone for promoting the recombination of charge carriers of the first and second conduction types.

* * * * *